(12) United States Patent
Balachandran

(10) Patent No.: US 6,608,828 B1
(45) Date of Patent: Aug. 19, 2003

(54) METHODS AND SYSTEMS FOR DECODING HEADERS THAT ARE REPEATEDLY TRANSMITTED AND RECEIVED ALONG WITH DATA ON A RADIO CHANNEL

(75) Inventor: Kumar Balachandran, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/396,145

(22) Filed: Sep. 15, 1999

(51) Int. Cl.⁷ .................................................. H04J 3/24
(52) U.S. Cl. ......................... 370/349; 370/392; 370/477
(58) Field of Search ................................. 370/338, 349, 370/389, 392, 401, 312, 477

(56) References Cited

U.S. PATENT DOCUMENTS 5,930,701 A    7/1999  Skog ........................... 455/415

FOREIGN PATENT DOCUMENTS

| EP | 0 984 641 A2 | 3/2000 |
| EP | 1 059 775 A1 | 12/2000 |
| WO | WO 97/48212 | 12/1997 |
| WO | WO 00/49748 | 8/2000 |

OTHER PUBLICATIONS

International Search Report, PCT/US00/21695, Jan. 19, 2001.
Casner et al., *Compressing IP/UDP/RTP Headers for Low–Speed Serial Links*, Network Working Group, Request for Comments: 2508, Online!, Feb. 1999, XP–002121319, pp. 1–22.
Åkesson, *GPRS, General Packet Radio Service*, 1995 Fourth IEEE International Conference on Universal Personal Communications Record, Nov. 6–10, 1995, pp. 640–643.
Bahl et al.; *Optimal Decoding of Linear Codes for Minimizing Symbol Error Rate*, IEEE Transactions on Information Theory, pp 284–287 (Mar. 1974).
Strauch et al.; *Low Complexity Source Controlled Channel Decoding in a GSM System*, IEEE Transactions on Information Theory, 43 No. 9:2445–2457 (Sep. 1995).
Berrou et al.; *Near Shannon Limit Error—Correcting Coding and Decoding: Turbo–Codes (1)*, IEEE pp1064–1070 (Feb. 1993).
GSM 05.03 V8.0.0 (Jul. 1999) Digital cellular telecommunications system (Phase 2+); Channel coding.
GSM 03.60 V5.2.0 Dec. 1997 Digital cellular telecommunications system (Phase 2+); General packet radio service (GPRS).
GSM 04.60 V6.2.0 (Oct. 1998) Digital cellular telecommunications system (Phase 2+); General packet radio service (GPRS).

*Primary Examiner*—Vivian Chin
*Assistant Examiner*—James K Moore
(74) *Attorney, Agent, or Firm*—Myers Bigel Sibley & Sajovec

(57) ABSTRACT

A header that is repeatedly transmitted and received, along with data, on a radio channel is decoded by initially decoding at least one initially received header to identify values for the header fields. The header fields include invariant header fields having determinate values and changing header fields having changing values. At least one subsequently received header is decoded using the determinate values for at least one of the invariant header fields, thereby allowing increased reliability decoding of at least one of the changing header fields. The subsequent decoding can use predictive decoding using a probability value of unity for symbols associated with at least one of the invariant header fields. Headers also may be decoded by repeatedly transmitting a first header including invariant header fields and changing header fields, along with data, over a radio channel during a persistent flow communication session. Upon successful decoding of a first header, the second header is repeatedly transmitted that includes the changing header fields but excludes at least one of the invariant header fields. The second header, including the changing header fields but excluding at least one of the invariant header fields then is decoded. The present invention may be particularly advantageous for decoding the Radio Link Control/Medium Access Control (RLC/MAC) header that includes a plurality of header fields and that is repeatedly transmitted and received along with data in the General Packet Radio System (GPRS) on a Global System for Mobile communication (GSM) radio channel.

70 Claims, 11 Drawing Sheets

METHODS AND SYSTEMS FOR DECODING HEADERS THAT ARE REPEATEDLY TRANSMITTED AND RECEIVED ALONG WITH DATA ON A RADIO CHANNEL

FIELD OF THE INVENTION

This invention relates to radio communication systems and methods, and more particularly to systems and methods for transmitting and receiving data on a radio channel.

BACKGROUND OF THE INVENTION

Public wireless radiotelephone systems are widely used to provide radiotelephone communications to subscribers. For example, the Global System for Mobile communications (GSM) system has been in service since the early 1990's. The design and operation of the GSM system is well known to those having skill in the art and need not be described further herein.

The GSM system has been extended in order to facilitate wireless packet data communications. In particular, the General Packet Radio Service (GPRS) has been designed to facilitate packet data communications over a radio channel. The GPRS system is described, for example, in European Telecommunications Standards Institute (ETSI) publication GSM 03.60 V.5.2.0 1997-1 entitled *Digital cellular telecommunications system (Phase 2+); General Packet Radio Service (GPRS); Service description; Stage 2 (GSM 03.60 version 5.2.0)*, the disclosure of which is incorporated herein by reference. The design and operation of GPRS is well known to those having skill in the art and need not be described further herein.

Extensions of GPRS, such as Enhanced GPRS (EGPRS) and Enhanced Data Rates for GSM Evolution (EDGE), now are being designed to facilitate high speed communication of multimedia data and packet-based voice, while allowing enhanced compatibility with external network protocols such as the Internet Protocol (IP). The EGPRS and EDGE systems are described in GSM 04.60 V6.2.0 (1998-10) entitled *Digital cellular telecommunications system (Phase 2+); General Packet Radio Service (GPRS); Mobile Station (MS)—Base Station System (BSS) interface; Radio Link Control/Medium Access Control (RLC/MAC) protocol* (GSM 04.60 Version 6.2.0 Release 1997) and GSM 05.03 V8.0.0 (1999-07) entitled *Digital Cellular Telecommunications System (Phase 2+); Channel Coding* (GSM 05.03 Version 8.0.0 Release 1999), the disclosures of which are hereby incorporated herein by reference. The design and operation of EGPRS and EDGE are well known to those having skill in the art and need not be described further herein.

FIG. 1 is an overall block diagram of a GPRS architecture. As shown in FIG. 1, the GPRS architecture includes a plurality of Mobile Stations (MS) that communicate with the GPRS network using a wireless radiotelephone link. An MS includes a Mobile Terminal (MT) and Terminal Equipment (TE). It will be understood that although the TE and MT are illustrated herein as two separate blocks, they may be implemented using shared components in a single portable housing. The Um access point is used for mobile access and the R reference point is used for origination or reception of messages. An inter-GPRS interface Gp connects two independent GPRS networks for message exchange. The Gi reference point connects the GPRS network to a Packet Data Network (PDN) or other networks. There may be more than a single GPRS network interface to several different packet data or other networks. These networks may both differ in ownership as well as in communications protocol such as X.25, TCP/IP, etc.

FIG. 2 is an overview of a GPRS logical architecture. As shown in FIG. 2, GPRS is logically implemented on a GSM structure through the addition of two network nodes, the serving GPRS Support Node (SPSN) and the Gateway GPRS Support Node (GGSN). The GGSN is a node that is accessed by the packet data network due to evaluation of a packet data protocol address. It contains routing information for attached GPRS users. The SGSN is the node that is serving the MS. At GPRS attach, the SGSN establishes a mobility management context containing information pertaining to, for example, mobility and security for the MS. The MS communicates with a plurality of Base Station Systems (BSS) using a wireless radiotelephone link. Other details of the GPRS logical architecture may be found in GSM 03.60 cited above, and need not be discussed further herein.

FIG. 3 illustrates a transmission plane of a GPRS system. As shown in FIG. 3, the transmission plane includes a layered protocol structure providing user information transfer, along with associated information transfer control procedures such as flow control, error detection, error correction, and error recovery. The transmission plane independence of the network subsystem platform from the underlying radio interface may be preserved via the Gb interface. As shown in FIG. 3, the primary Layer 2 (L2) interface between the MS and the BSS is through the Radio Link Control/Medium Access Control (RLC/MAC) block. The RLC portion offers access to control mechanisms associated with the radio resource. The MAC portion allows access to a physical layer. The transmission plane of FIG. 3 and the RLC/MAC block are defined in the above-cited GSM 03.60 and GSM 04.60.

FIGS. 4A and 4B illustrate a downlink RLC data block with an MAC header and an uplink RLC data block with an MAC header, respectively, for GPRS. The design of the data blocks and the fields therein are defined in the above-cited GSM 04.60 and will not be described further herein.

In providing real-time services such as multimedia and voice under GPRS, it is generally desirable to reduce the protocol related overhead burden introduced by the PDNs or other networks of FIG. 1. Protocol overheads may be reduced by introducing two bearers. The first bearer is called Optimized Voice over EGPRS (OVE), and may be used to offer packet voice services akin to standard telephony and to optimize for maximum spectral efficiency. For the OVE bearer, the only overhead may result from the inband signaling due to the Adaptive Multi-Rate (AMR) vocoder, the RLC/MAC overhead and channel coding. The second bearer is called a General Real-Time Service over EGPRS (GRE), that may be used to offer multimedia services with end-to-end IP connectivity. Such a bearer may be used for applications such as video telephony. The RLC/MAC overhead may be the same as the OVE case. Additional overhead may include a link layer and optional link fields that delineate a plurality of link layer frames.

Accordingly, a major contributor to overhead is the RLC/MAC header that is repeatedly transmitted and received along with data in GPRS/EGPRS on a GSM radio channel. In GPRS/EGPRS, the header and data are coded separately. The performance of the header may be worse than the performance of the payload for at least some of the AMR modes in OVE and for at least some of the coded schemes for GRE bearers. This may lead to loss of performance due to, for example, front-end clipping of speech or video. Accordingly, there is a need to provide reliable decoding of headers without excessively contributing to overhead.

It is known to provide sufficient amounts of channel coding to provide adequate header performance. However, it is also desirable to reduce and preferably minimize the overhead due to channel coding. Thus, for example, the RLC/MAC payload may be coded using as low a rate as 1/12 for the convolutional code while the header may be coded only up to a rate 1/3 in order to maximize the amount of channel coding available for data. Thus, there continues to be a need for systems and methods for reliably decoding an RLC/MAC header without contributing excessively to overhead.

SUMMARY OF THE INVENTION

It therefore is an object of the present invention to provide improved systems and methods for transmitting and receiving data on radio channels.

It is another object of the present invention to provide systems and methods for decoding a header that is repeatedly transmitted and received along with data on a radio channel.

It is still another object of the present invention to provide systems and methods that can reliably decode headers without contributing excessively to overhead on the radio channel.

These and other objects may be provided according to the present invention by methods and systems for decoding a header that includes a plurality of header fields and that is repeatedly transmitted and received along with data on a radio channel, by initially decoding at least one initially received header to identify values for the plurality of header fields. The plurality of header fields include invariant header fields having determinate values and changing header fields having changing values. As used herein, invariant header fields generally do not change during a persistent flow communication session of packetized data (including voice, multimedia and/or processed data) whereas changing data fields generally may change with each data packet. At least one subsequently received header is decoded using the determinate values for at least one of the invariant header fields, thereby allowing increased reliability decoding of at least one of the changing header fields. Later, a second header, including the changing header fields but excluding at least one of the invariant header fields, along with data, may be received and decoded, in response to successfully decoding the at least one subsequently received header using the determinate values for at least one of the invariant header fields.

The invention stems from the realization that real-time flow (a persistent flow) that has gained control of a radio channel, such as a time slot in a TDMA frame in a GSM system, is likely to retain control of the radio resource in a continuous manner until the real-time flow proceeds into discontinuous transmissions. Thus, successive uses of the TDMA channel, such as the associated GSM TDMA frame, will likely be from the same real-time flow. Assumptions therefore can be made about the value of invariant header fields during subsequent transmission and reception, to allow improved decoding of the changing header fields based upon these assumptions.

Initial decoding of the at least one initially received header may use predictive decoding to identify soft values for symbols associated with the plurality of header fields. Subsequent decoding can subsequently predictive decode at least one subsequently received header using a probability value of unity or other constrained decoding for symbols associated with at least one of the invariant header fields, thereby allowing increased reliability predictive coding of at least one of the changing header fields. Initial decoding may be repeatedly performed for a predetermined number of times. Alternatively, initial decoding may be repeatedly performed until the values for the plurality of header fields are successfully identified relative to a selection criterion.

The present invention may be particularly advantageous for decoding the Radio Link Control/Medium Access Control (RLC/MAC) header that includes a plurality of header fields and that is repeatedly transmitted and received along with data in the General Packet Radio System (GPRS) on a Global System for Mobile communication (GSM) radio channel. In particular, for the RLC/MAC header, at least one initially received RLC/MAC header is initially decoded to identify values for the plurality of header fields. The plurality of header fields include invariant header fields having determinate values and a Coding and Puncturing Scheme (CPS) header field having changing values. At least one subsequently received header is then subsequently decoded using the determinate values for at least one of the invariant header fields, to thereby allow increased reliability decoding of the CPS header field by constrained decoding candidate selection. In the RLC/MAC header, a Power Reduction (PR) field also may have changing values, albeit very rarely, so that during subsequent decoding at least one subsequently received header is decoded using the determinate values for at least one of the invariant header fields, to thereby allow increased reliability decoding of both the CPS and PR fields. During this decoding, the PR field may be treated as invariant, to thereby allow increased reliability decoding of the CPS field. As was described above, predictive decoding may be used and initial decoding may be repeatedly performed for a predetermined number of times or until the values for the plurality of header fields are successfully identified.

According to another aspect of the present invention, headers are decoded by repeatedly transmitting a first header including invariant header fields and changing header fields, along with data, over a radio channel during a persistent flow communication session. The first header, including the invariant header fields and the changing header fields, is decoded and an indication may be provided that the first header, including the invariant header fields and the changing header fields, has been decoded successfully. Upon successful decoding of the first header, a second header is repeatedly transmitted that includes the changing header fields but excludes at least one of the invariant header fields. The second header, including the changing header fields but excluding at least one of the invariant header fields, then is decoded.

This aspect of the invention stems from a realization that once the invariant fields of the header have been decoded successfully, they need not be repeated in subsequent headers. Accordingly, a new header may be used that need only include the changing header fields but that can exclude at least one of the invariant header fields. The same coded header length as the first header may be employed so that the rate of coding can increase and allow improved reliability of decoding the changing header fields. Thus, the first header and the second header preferably have the same coded length, wherein the first header is decoded at a first decoding rate and the second header is decoded at a second decoding rate that is higher than the first decoding rate. At least one stealing bit may be used to indicate transmission of the second header rather than the first header.

This aspect of the invention also may be applied to the RLC/MAC header by repeatedly transmitting a first RLC/MAC header including invariant header fields and a CPS header field having changing values, along with data, over the GSM radio channel during a persistent flow communication session. The first header, including invariant header fields and the CPS header field, is decoded. An indication of successful decoding may be provided. A second RLC/MAC header, including the CPS header field but excluding at least one of the invariant header fields, along with data associated with the persistent flow communication session, then is repeatedly transmitted over the GSM radio channel in response to the indication. The second RLC/MAC header then is decoded. The second RLC/MAC header also may include the PR header field as well as the CPS header field. As was described above, the PR header field may be treated as being invariant in the second RLC/MAC header. Accordingly, reliable decoding of headers may be provided without the need to contribute excessively to overhead.

DETAILED DESCRIPTION OF PREFERRED EMBODIMENTS

Figure 1:
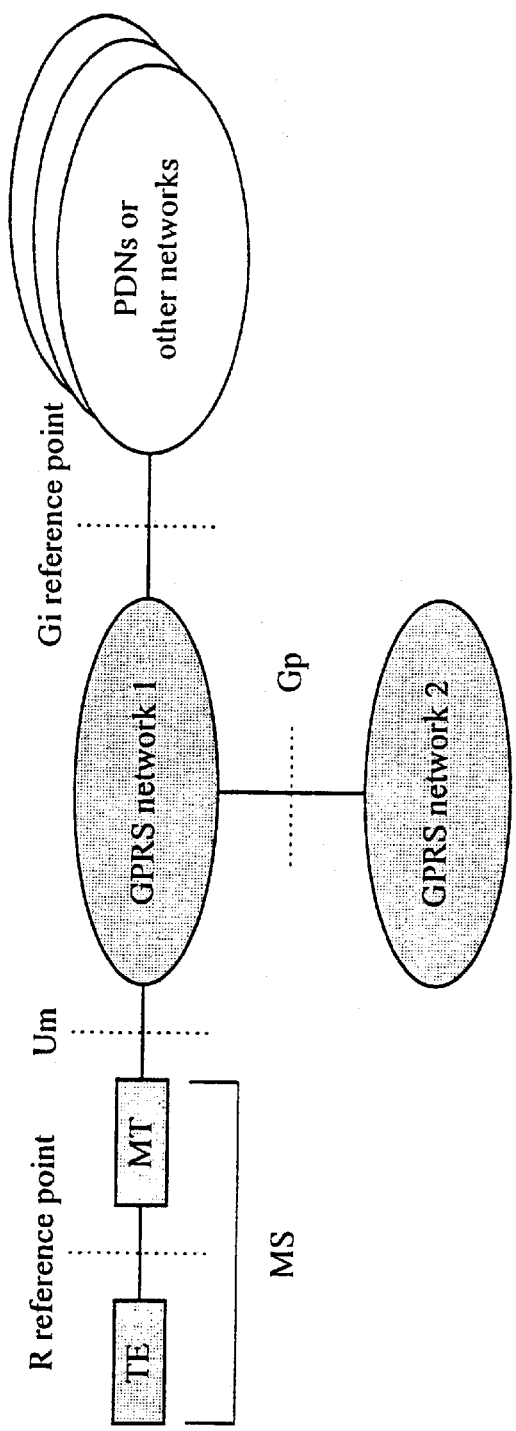
FIG. 1 is an overall block diagram of a GPRS system.
Figure 2:
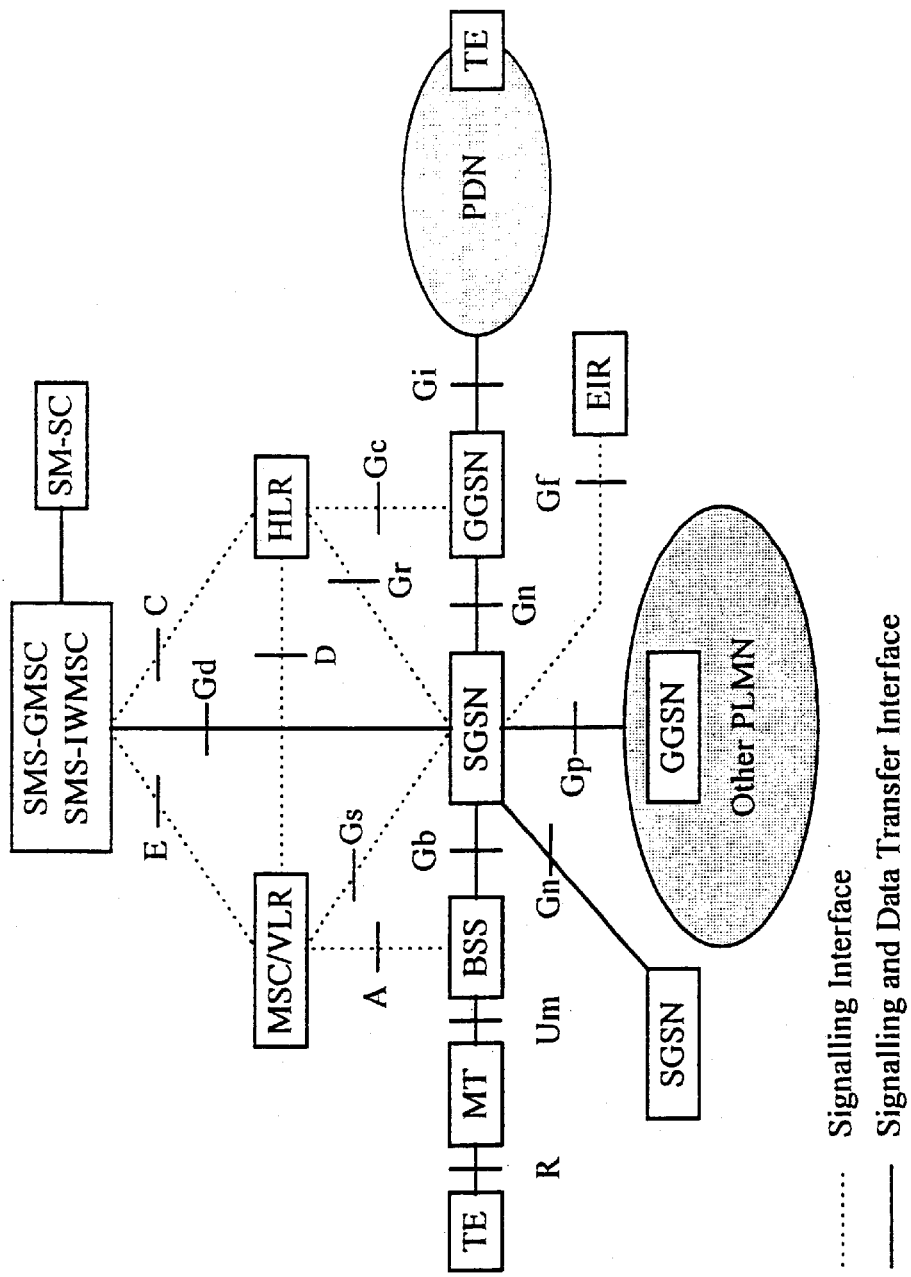
FIG. 2 illustrates a logical architecture for a GPRS system.
Figure 3:
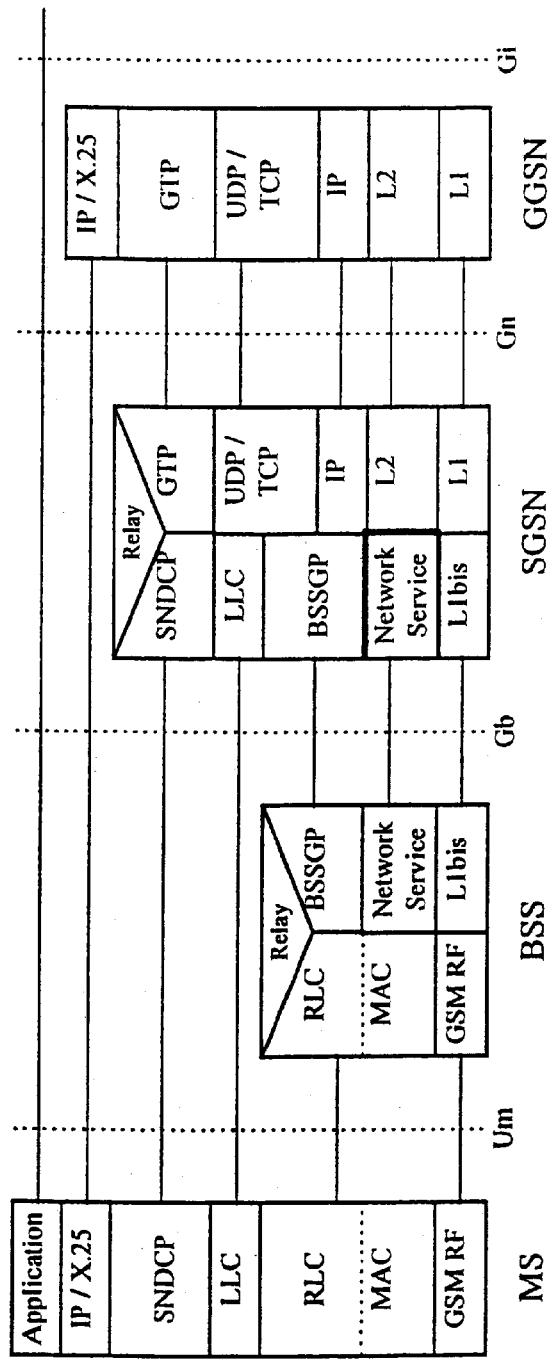
FIG. 3 illustrates a conventional protocol stack for the transmission plane of a GRPS system.
Figure 4A:
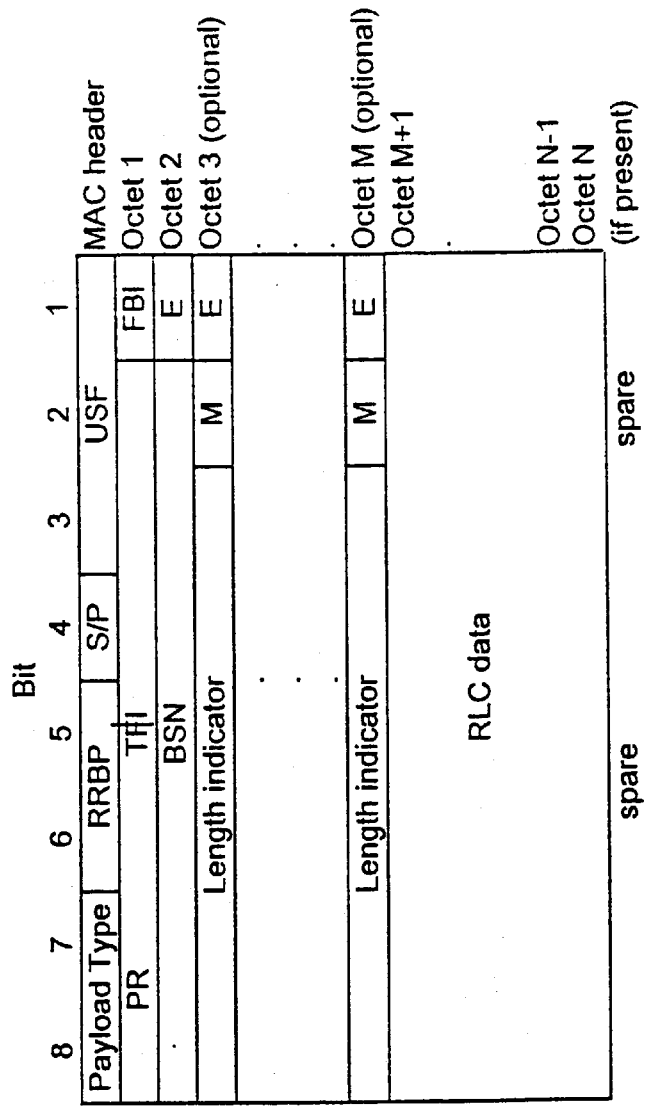
FIGS. 4A and 4B illustrate downlink and uplink RLC data blocks with MAC headers, respectively, for a GPRS system.
Figure 4B:
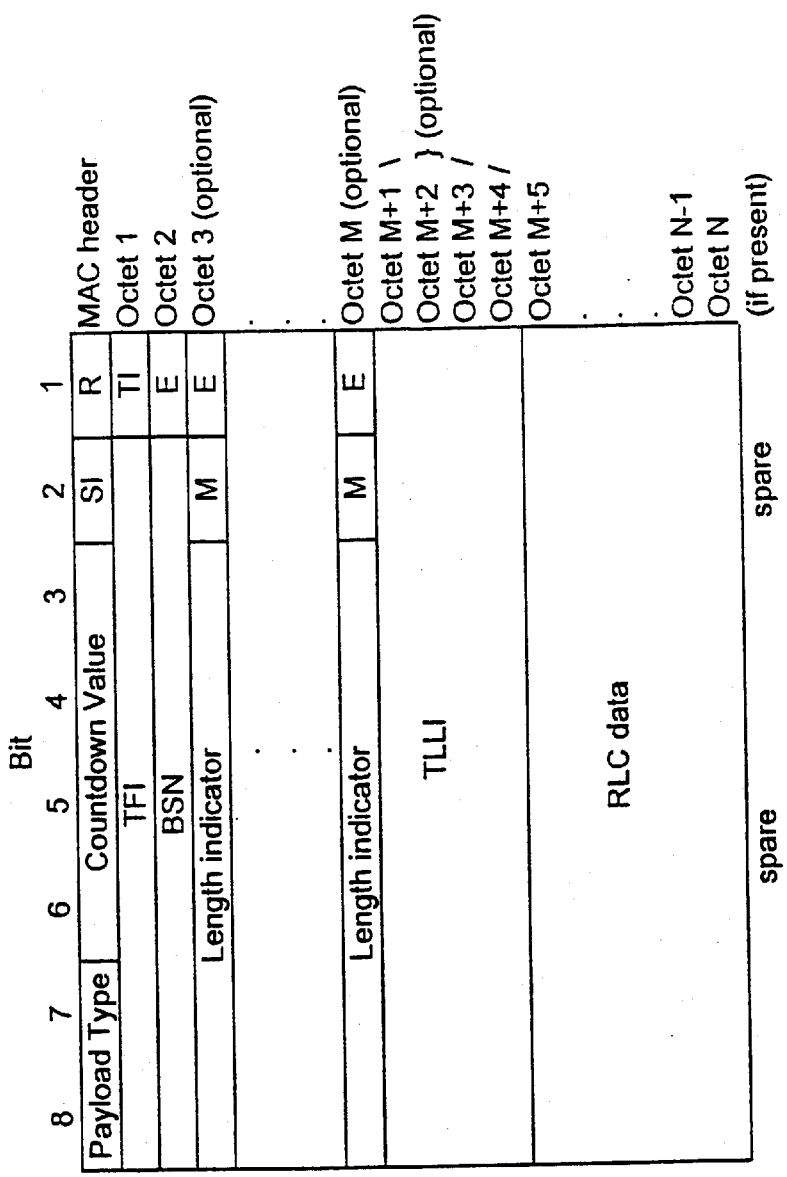

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As will be appreciated by one of skill in the art, the present invention may be embodied as methods, systems (apparatus), or computer program products. Accordingly, the present invention may take the form of an entirely hardware embodiment, an entirely software embodiment or an embodiment combining software and hardware aspects.

Various aspects of the present invention are illustrated in detail in the following Figures, including block diagram and flowchart illustrations. It will be understood that each block, and combinations of blocks, can be implemented by computer program instructions. These computer program instructions may be provided to a processor or other programmable data processing apparatus to produce a machine, such that the instructions which execute on the processor or other programmable data processing apparatus create means for implementing the functions specified in the block or blocks. These computer program instructions may also be stored in a computer-readable memory that can direct a processor or other programmable data processing apparatus to function in a particular manner, such that the instructions stored in the computer-readable memory produce an article of manufacture including instruction means which implement the functions specified in the flowchart block or blocks.

Accordingly, blocks of the illustrations support combinations of means for performing the specified functions, combinations of steps for performing the specified functions and program instructions for performing the specified functions. It will also be understood that each block of the illustrations, and combinations of blocks in the illustrations, can be implemented by special purpose hardware-based computer systems which perform the specified functions or steps, or by combinations of special purpose hardware and computer instructions.

The present invention stems from the realization that many of the fields in the RLC/MAC header are generally determinate from one RLC/MAC header to another during a real-time flow. Thus, once the header is decoded correctly, only the Coding and Puncturing Scheme (CPS) field, and possibly the Power Reduction (PR) field, may change. The CPS field generally will change. The PR field likely will not change when the mobile terminal is on the same channel, so that the power assignment received by a single Base Station System between handovers remains constant. This field will, however, likely change when the mobile terminal changes RAN domains or even changes Base Station System sites.

Accordingly, once the real-time flow has been identified, many of the fields in the RLC/MAC header are unchanging. This means that with a probability of one, the receiver has knowledge of the a priori values of many of the header fields.

On the start of a real-time flow such as a talk spurt, the header is decoded on successive RLC/MAC blocks, preferably by accumulating soft values until the values for the plurality of header fields are successfully identified, for example by satisfying a predetermined confidence selection criterion. For example, the header may be decoded until the Cyclic Redundancy Check (CRC) passes. Alternatively, the header may be decoded for a determinate number of successive RLC/MAC blocks. Decoding may be performed using well known techniques such as A Posteriori Soft Output Viterbi Algorithm (APRI SOVA) decoding or Maximum A Posteriori (MAP) decoding with a priori values fed from preceding frames. APRI SOVA decoding is described in publications entitled *Low Complexity Source Controlled Channel Decoding in a GSM System* by Strauch, et al., *IEEE*, pages 2571–2574 (1999), and *Source-Controlled Channel Decoding* by Hagenauer, *IEEE Transactions on Communications*, Vol. 43, No. 9, pages 2248–2456

(September 1995), and the MAP algorithm is described in *Optimal Decoding of Linear Codes for Minimizing Symbol Error Rate* by Bahl et al., *IEEE Transactions on Information Theory*, March 1994, pages 284–287, and need not be described further herein.

Once the flow has been identified as a real-time flow belonging to the user, the known fields may be treated as determinate bits, by, for example, using a priori probability values of unity. The unknown fields then can have greater reliability coming out of the decoder compared to the a priori values of fields around the unknown bits being unknown. Upon several failures of the CRC for the subsequent header, a link failure may be declared and re-establishment procedures may be carried out.

Figure 5:
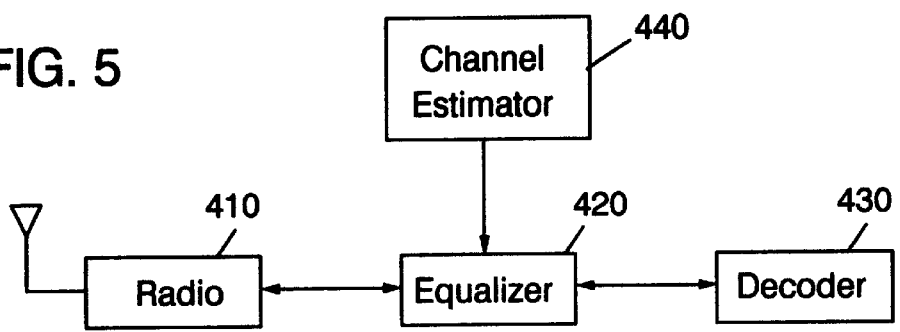
FIG. 5 is a simplified block diagram of a Mobile Station (MS) according to an embodiment of the present invention.

FIG. 5 is a simplified block diagram of a Mobile Station according to the present invention. As shown in FIG. 5, the Mobile Station includes a radio section 410 that demodulates the radio signal, an equalizer 420 that produces a stream of bits, a channel estimator 440 that estimates the effect of the channel, and a decoder 430 that decodes the stream of bits. According to the invention, the decoder 430 preferably is a predictive decoder such as an APRI SOVA or MAP decoder. As is well known in the art, the equalizer 420 also may implement a soft output Viterbi algorithm or a MAP algorithm. After initially decoding at least one initially received header to identify values for invariant header fields and changing header fields, subsequent decoding may be improved by using a probability value of unity for at least one of the invariant header fields, to thereby allow increased reliability predictive decoding of at least one of the changing header fields.

Figure 6A:
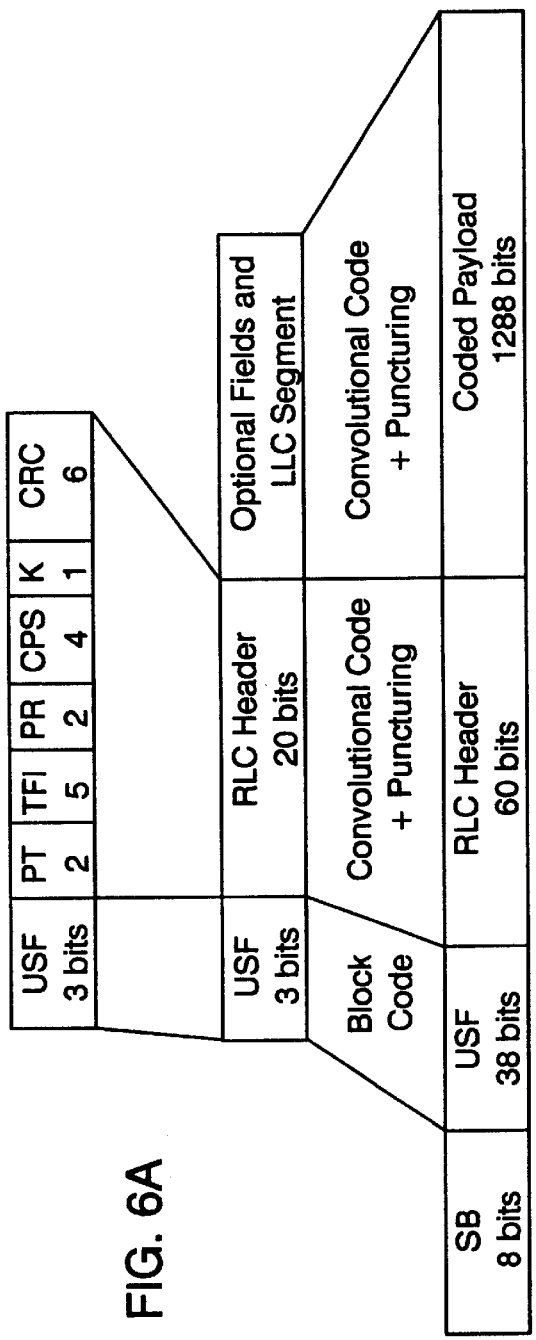
FIGS. 6A and 6B illustrate examples of a proposed RLC/MAC block for EGPRS in 8-Phase Shift Keying (8PSK) mode and Gaussian Minimum Shift Keying (GMSK) mode, respectively.
Figure 6B:
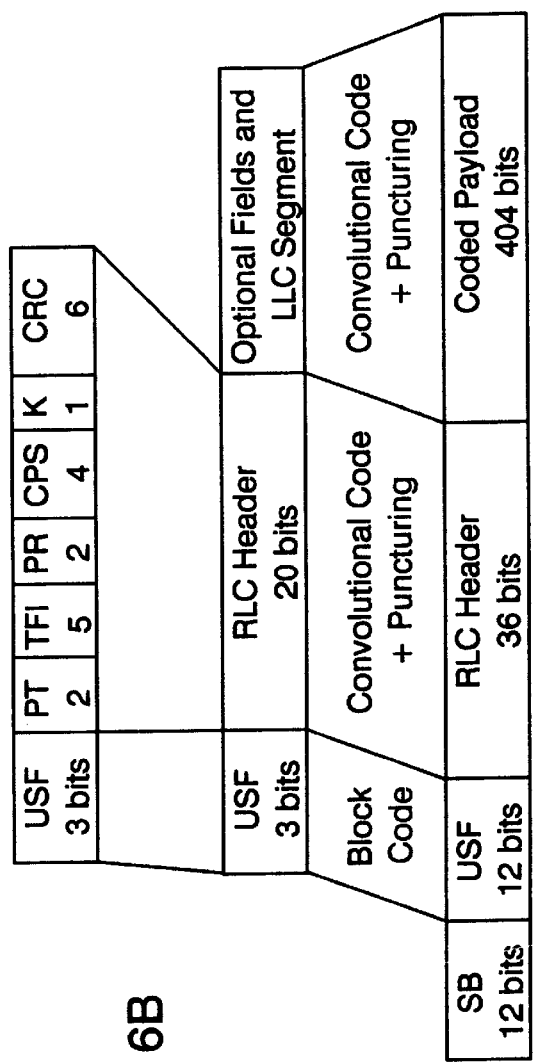

FIGS. 6A and 6B illustrate examples of proposed RLC/MAC blocks for EGPRS systems in an 8 Phase Shift Keying (8PSK) and Gaussian Minimum Shift Keying (GMSK) mode, respectively. After channel coding, the RLC/MAC block spans 4 time slots that are distributed over 4 frames, each frame including 8 slots, in the GSM Time Division Multiple Access (TDMA) frame structure. The coded data generally is interleaved over these 4 time slots. The coding rate achievable can vary between 1/12 and 1/5 for 8PSK and 1/4 to 1/2 for GMSK. The RLC/MAC block includes an Uplink State Flag (USF) field that allows the Mobile Terminals to sense the state of the uplink channel. A Payload Type (PT) flag identifies the type of real-time traffic. A Temporary Flow Identifier (TFI) field identifies the Temporary Block Flow to which the data belongs. A Power Reduction (PR) field denotes the reduction in power relative to the BCCH in the next RLC/MAC block. The Coding and Puncturing (CPS) field denotes the channel coding protocol. The encryption indicator (K) denotes whether encryption is active. CRC is a Cyclic Redundancy Check field. The fields in the RLC/MAC block are well known to those having skill in the art and need not be described in further detail herein.

Figure 7:
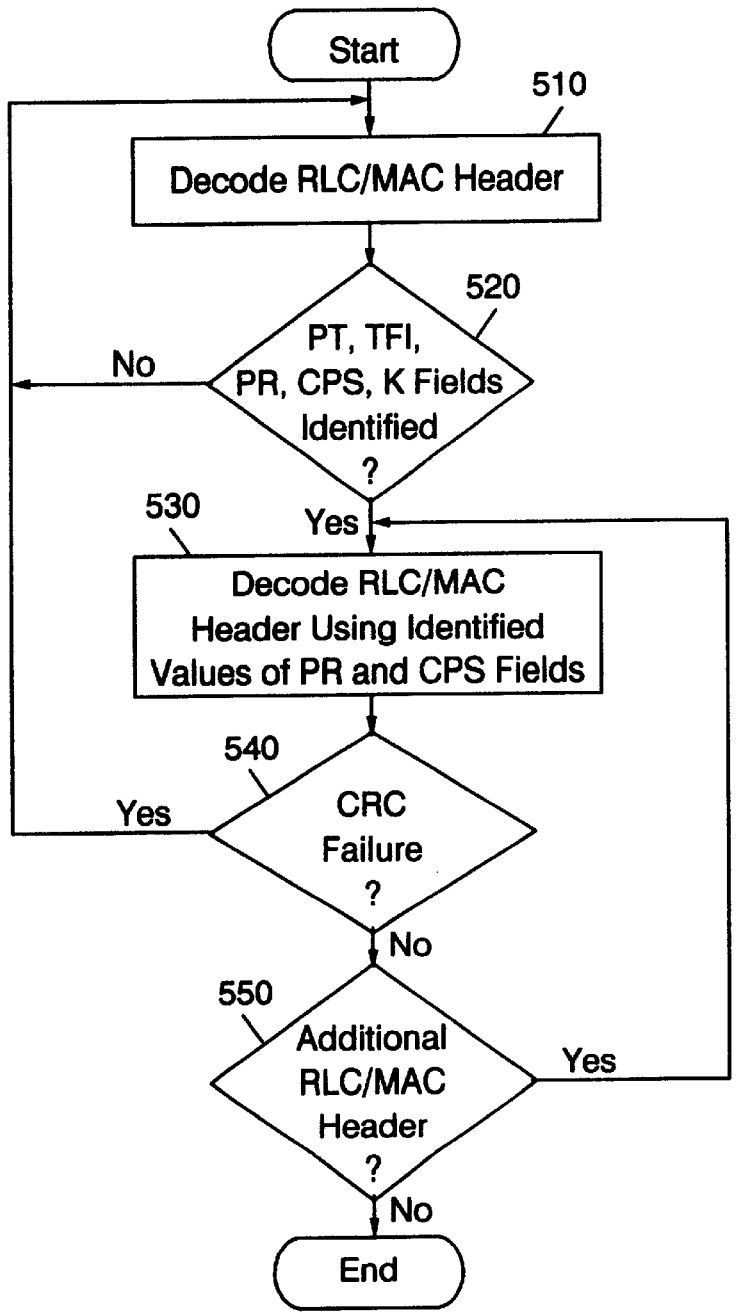
FIG. 7 is a flowchart illustrating operations for decoding an RLC/MAC header according to an embodiment of the present invention.

FIG. 7 is a flowchart illustrating operations for decoding an RLC/MAC header according to the present invention. As shown in FIG. 7, operations begin by initially decoding at least one initially received RLC/MAC header to identify values for the plurality of header fields (block 510). A plurality of header fields include invariant header fields such as PT, TFI, and/or K having determinate values, and the CPS and/or PR fields that have changing values. A test is made at block 520 as to whether at least some of the PT, TFI, PR, CPS, and K fields have been successfully decoded. For example, passing the Cyclic Redundancy Check (CRC) can indicate successful decoding. If not, operations return to block 510 and an additional RLC/MAC header is decoded on the next transmission. If yes, then operations proceed. It also will be understood that the initial decoding operations in blocks 510 and 520 may be repeatedly performed for a determinate number of RLC/MAC headers, such as five headers, in order to increase the likelihood that all of the fields have been identified.

Continuing with the description of FIG. 7, once the fields have been properly identified, then at block 530, a subsequently received RLC/MAC header is decoded using the determinate values for the PR and/or CPS fields, thereby allowing increased reliability decoding of the PR and/or CPS header fields. This may be accomplished by using the known fields with a priori probability values of unity. The unknown fields then may have greater reliability coming out of the decoder than if the a priori values of fields around unknown bits were not known. In particular, the decoder 430 of FIG. 5 is provided probability values of unity for the symbols associated with invariant header fields.

At block 540 a test is made as to whether there is a CRC failure for the a priori decoding. If this is the case, a link failure may be declared and re-establishment procedures may be carried out. If not, subsequently received RLC/MAC headers (block 550) are decoded using the a priori values for PR and/or CPS fields by repeating the operations at blocks 530–540. The size of the coded header preferably should remain constant to allow the receiver to decode the channel without the need for stealing bits.

Figure 8B:
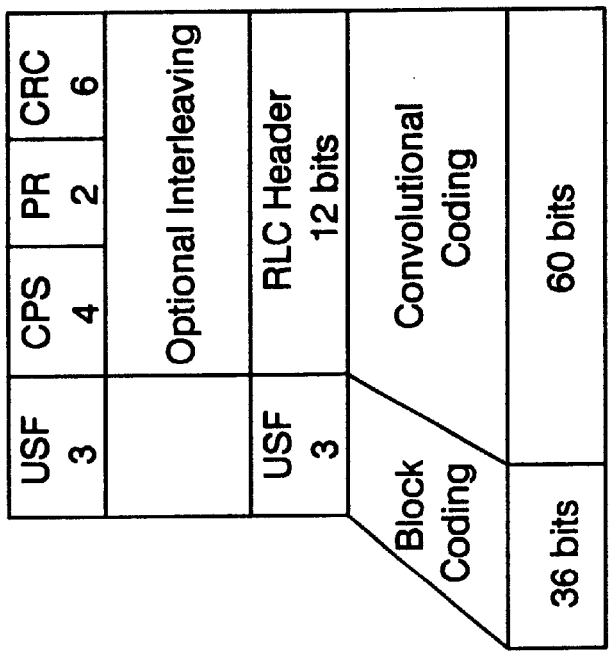
FIGS. 8A and 8B illustrate respective first and second versions of an RLC/MAC header according to an embodiment of the present invention.
Figure 8A:
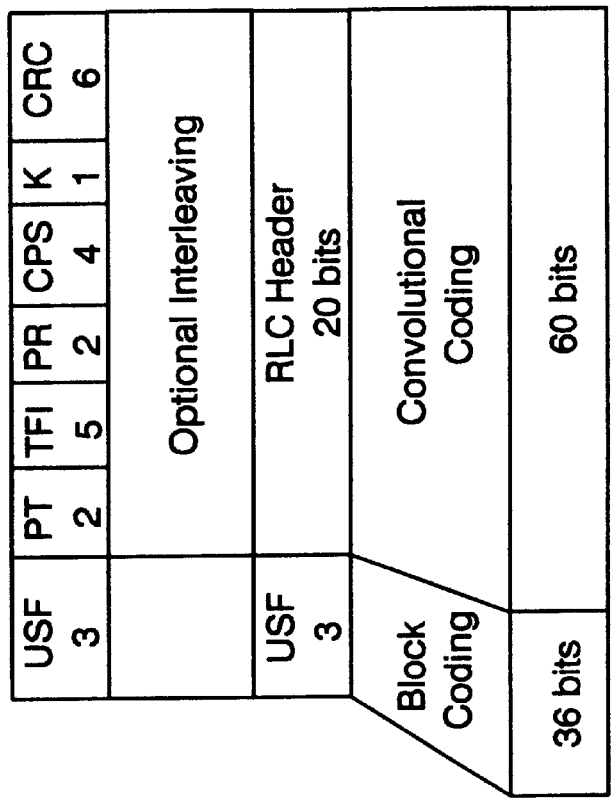

Efficient decoding of headers according to a second aspect of the present invention now will be described. This aspect of the invention uses two headers that are repeatedly transmitted and received along with data on a radio channel. FIG. 8A and FIG. 8B provide an example of a first (long) and second (short) version of an RLC/MAC header, respectively. The header of FIG. 8A is the same as the RLC/MAC header that was illustrated in FIG. 6A. As shown in FIG. 8A, the first header includes the invariant fields PT, TFI, and/or K and the changing fields CPS and/or PR. Optional interleaving is used to produce a 20-bit RLC header and convolutional coding is used to produce a 60-bit RLC header.

In contrast, in FIG. 8B, only the changing fields (CPS and/or PR) are included. Optional interleaving is used to produce an RLC header of 12-bits. convolutional coding then is used, preferably to produce the same size (60-bit) RLC header as in FIG. 8A. Accordingly, the second header codes only the CPS and/or PR fields up to the same coded header length (60-bits) as the first header. Thus, the rate of coding now can go up to 1/12 with puncturing, allowing improved reliability and allowing similar margins between the data and the header.

Figure 9:
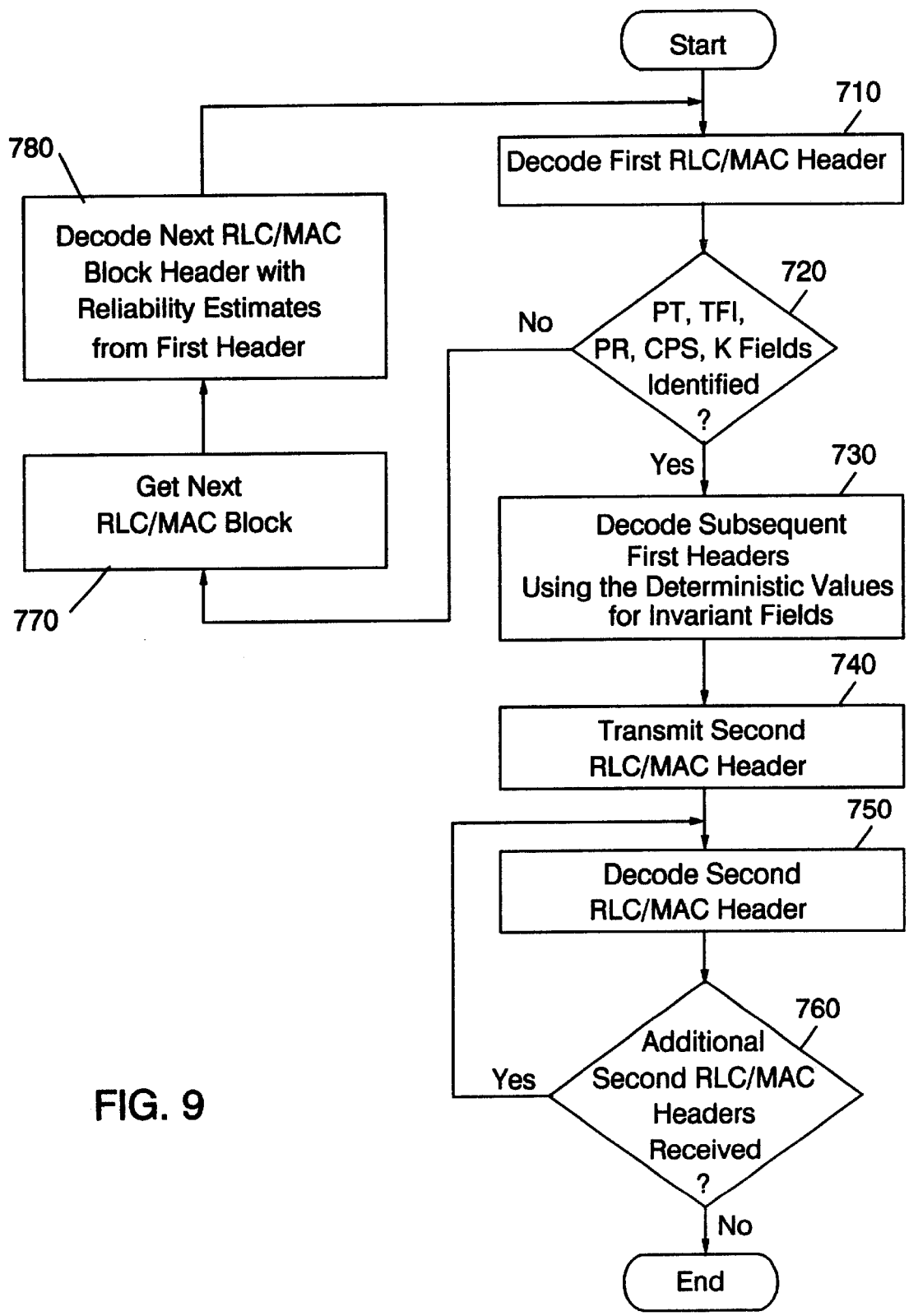
FIG. 9 is a flowchart illustrating operations for decoding the first and second headers of FIGS. 8A and 8B according to an embodiment of the present invention.

FIG. 9 is a flowchart illustrating operations for decoding first and second headers according to the present invention. As shown in FIG. 7, the first RLC/MAC header of FIG. 8A is repeatedly transmitted and decoded at block 710. At block 720, a test is made as to whether at least some of the fields in the header have been identified. If not, then at block 770 the next RLC/MAC block may be obtained from a buffer that stores the undecoded or unreliable headers and payloads until decoding is complete. The use of a buffer can prevent the real-time flow from being subject to front end clipping. The size of the buffer may depend on the maximum allowable latency for the flow. Maximum latency for the flow may depend on quality of service which may be specified as provided in application Ser. No. 09/396,990 to the present inventor entitled Methods and Systems for Specifying a Quality of Service for Communication Between a Mobile Station and a Packet Wireless Communications Network Based Upon an Application That is Executing on the Mobile Station, filed concurrently, the disclosure of which is hereby incorporated herein by reference.

Then, at block 780, the next RLC/MAC block header is decoded with reliability estimates from the first header. Accordingly, subsequent decoding of RLC/MAC block headers can provide progressively more reliable estimates for at least one of the invariant header fields. As will be described below, once decoding is successful, determinant values may be used.

Alternatively, the first header may be repeated for several radio link blocks until the invariant fields in the header are likely to be decoded. For example, the first header may be repeated five times. The decoding in block 710 may be performed using techniques such as majority voting. Alternatively, decoding may be performed until the CRC passes. In yet another alternative, the decoder can combine soft information from successive receiver samples that are provided by the equalizer 420. If decoding fails after five trials, an RLC block denoting a Not Ready condition may be used to reset the transmission on the return channel and the operations can start again. Once the first RLC/MAC header is decoded properly at block 720, subsequent first headers are decoded using the deterministic values of the invariant fields, at block 730. An indication may be provided to the transmitter that successful decoding of the first header has been performed. However, if a predetermined number of first headers is transmitted, an indicator may not need to be provided.

Referring now to block 740, if a Not Ready condition is not received for a determinate number of RLC blocks, and/or upon expiration of a timer, and/or if the fields in the first header are properly identified, a second (short) RLC/MAC header of FIG. 8B is transmitted and received at block 740 and is decoded at block 750. The short header preferably is transmitted with more channel coding than the longer header. As additional second RLC/MAC headers are received (block 760), they are decoded, along with data, at block 750 until all the data is received and decoded.

Figure 10:
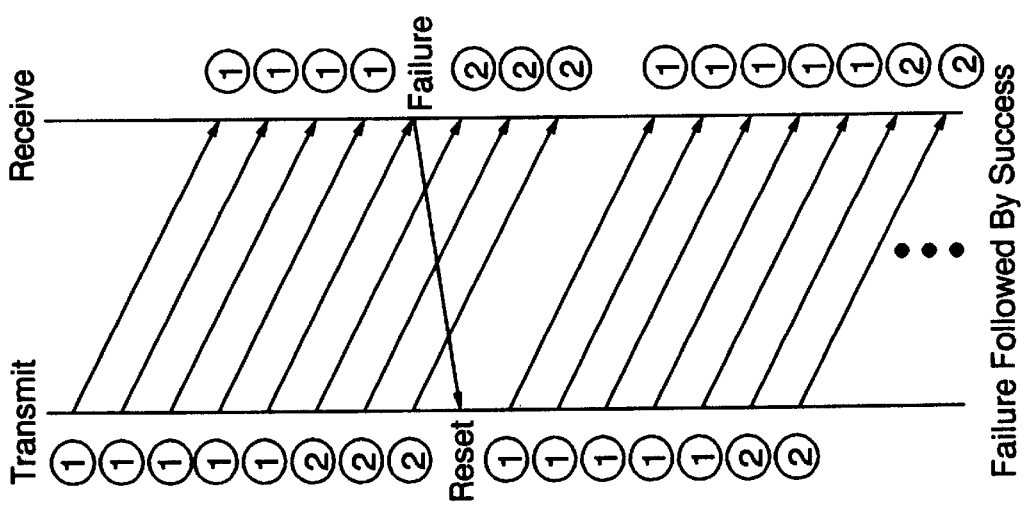
FIGS. 10A and 10B illustrate examples of successful and unsuccessful transmissions of a first header according to an embodiment of the present invention.

The second RLC/MAC header (FIG. 8B) may be distinguished from the first RLC/MAC header of FIG. 8A by using one or more stealing bits to denote the header type. Alternatively, if a determinate number of first headers are transmitted, then stealing bits need not be used to determine the header type, and the receiver need not rely on the margin for the coded stealing bit to determine the header type. FIG. 10A illustrates transmission of the first header from a transmitter to a receiver for a predetermined number (five) times followed by transmission of the second RLC/MAC header upon successful transmission of the first header for five times. In contrast, FIG. 10B illustrates unsuccessful transmission of the first RLC header and retransmission of the first RLC header. In FIG. 10B, if the link must be reset three consecutive times, transmission may be suspended. Other transmission and/or time-out techniques may be used, as described above.

Figure 11:
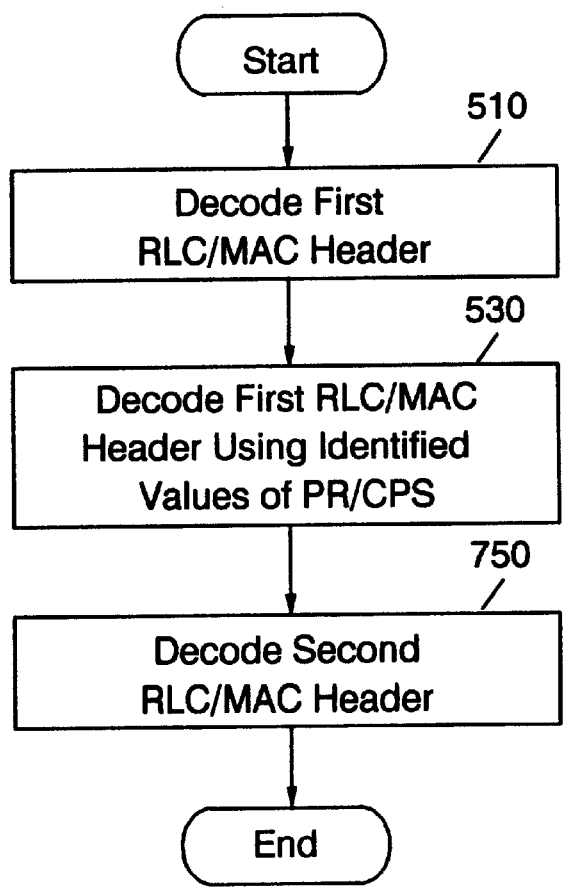
FIGS. 11 and 12 are flowcharts that illustrate combining operations of FIGS. 7 and 9 according to an embodiment of the present invention.

The techniques of FIG. 7 and FIG. 9 may be used in combination. Thus, for example, as shown in FIG. 11, the operations of FIG. 7 may be followed by the operations of FIG. 9. In particular, the first RLC/MAC header is first decoded at block 510. Then, once identified values of PR and/or CPS are obtained, the first RLC/MAC header is decoded using these identified values at block 530. The short (second) RLC/MAC header is then decoded at block 750, for example using an a priori value for the PR field.

Figure 12:
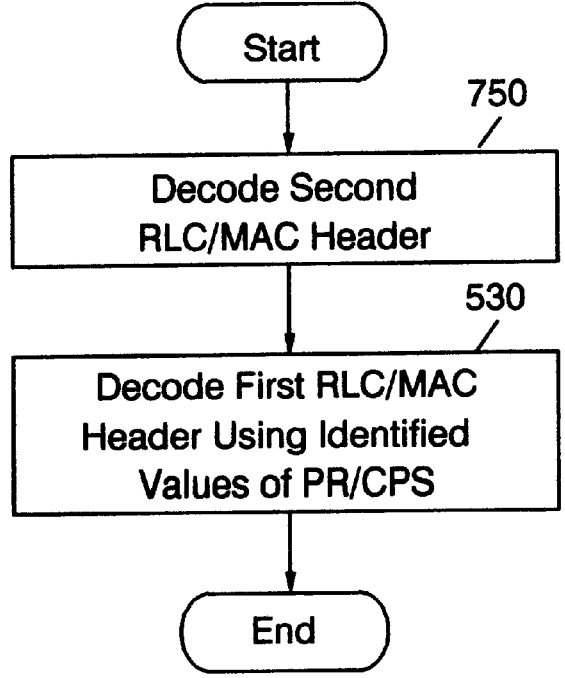

In another alternative, shown in FIG. 12, initial transmission begins by transmitting the second RLC/MAC header, and decoding at block 750. Once successfully decoded, the first RLC/MAC header may be decoded using the identified values of PR and/or CPS at block 530. Other combinations of the techniques of FIGS. 7 and 9 may be provided. Accordingly, reliable decoding of headers may be provided without contributing excessively to overhead.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of decoding a header that includes a plurality of header fields and that is repeatedly transmitted and received along with data on a radio channel, the decoding method comprising the steps of:

initially decoding at least one initially received header to identify values for the plurality of header fields, the plurality of header fields including invariant header fields having determinate values and changing header fields having changing values; and subsequently decoding at least one subsequently received header using the determinate values for at least one of the invariant header fields.

2. A method according to claim 1 wherein the subsequently decoding step is followed by the step of:

decoding a second header, including the changing header fields but excluding at least one of the invariant header fields, along with data, in response to successfully decoding that at least one subsequently received header using the determinate values for at least one of the invariant header fields.

3. A method according to claim 1:

wherein the step of initially decoding comprises the step of initially predictive decoding at least one initially received header to identify soft values for symbols associated with the plurality of header fields, the plurality of header fields including invariant header fields having determinate values and changing header fields having changing values; and wherein the step of subsequently decoding comprises the step of subsequently predictive decoding at least one subsequently received header using a probability value of unity for symbols associated with at least one of the invariant header fields.

4. A method according to claim 1 wherein the step of initially decoding at least one initially received header to identify values for the plurality of header fields, is repeatedly performed for a predetermined number of times or until the values for the plurality of header fields satisfy a selection criterion.

5. A method according to claim 1 wherein the step of subsequently decoding comprises the steps of:

subsequently decoding at least one subsequently received header using progressively more reliable estimates of the values for at least one of the invariant header fields; and upon successful decoding, decoding at least one subsequently received header using the determinate values for at least one of the invariant header fields.

6. A method according to claim 5 wherein the following step is performed prior to the subsequent decoding step:

buffering the headers until successful decoding.

7. A method for decoding a Radio Link Control/Medium Access Control (RLC/MAC) header that includes a plurality of header fields and that is repeatedly transmitted and received along with data in a General Packet Radio System (GPRS) on a Global System for Mobile communication (GSM) radio channel, the decoding method comprising the steps of:

initially decoding at least one initially received RLC/MAC header to identify values for the plurality of header fields, the plurality of header fields including invariant header fields having determinate values and a Coding and Puncturing Scheme (CPS) header field having changing value; and subsequently decoding at least one subsequently received RLC/MAC header using the determinate values for at least one of the invariant header fields.

8. A method according to claim 7 wherein a Power Reduction (PR) field of the RLC/MAC header also has changing values, the subsequently decoding step comprising the step of:

subsequently decoding at least one subsequently received header using the determinate values for at least one of the invariant header fields.

9. A method according to claim 7 wherein the subsequently decoding step is follows by the step of:

decoding a second header, including the CPS header field but excluding at least one of the invariant header fields, along with data, in response to successfully decoding the at least one subsequently received header using the determinate values for at least one of the invariant header fields.

10. A method according to claim 8 wherein the subsequently decoding step is followed by the step of:

decoding a second header, including the CPS and the PR header fields but excluding at least one of the invariant header fields, along with data, in response to successfully decoding the at least one subsequently received header using the determinate values for at least one of the invariant header fields.

11. A method according to claim 7:

wherein the step of initially decoding comprises the step of initially predictive decoding at least one initially received header to identify soft values for symbols associated with the plurality of header fields, the plurality of header fields including invariant header fields having determinate values and a CPS header field having changing values; and wherein the step of subsequently decoding comprises the step of subsequently predictive decoding at least one subsequently received header using a probability value of unity for symbols associated with at least one of the invariant header fields.

12. A method according to claim 7 wherein the step of initially decoding at least one initially received header to identify values for the plurality of header fields, is repeatedly performed for a predetermined number of times or until the values for the plurality of header fields satisfy a selection criterion.

13. A method according to claim 7 wherein the step of subsequently decoding comprises the steps of:

subsequently decoding at least one subsequently received RLC/MAC header using progressively more reliable estimates of the values for at least one of the invariant header fields; and upon successful decoding, decoding at least one subsequently received RLC header using the determinate values for at least one of the invariant header fields.

14. A method according to claim 13 wherein the following step is performed prior to the subsequent decoding step:

buffering the RLC/MAC headers until successful decoding.

15. A method of decoding headers that are repeatedly transmitted and received along with data on a radio channel during a persistent flow communication session, the decoding method comprising the steps of:

repeatedly transmitting a first header, including invariant header fields and changing header fields, along with data associated with the persistent flow communication session, over the radio channel;

decoding the first header;

repeatedly transmitting a second header, including the changing header fields but excluding at least one of the invariant header fields, along with data associated with the persistent flow communication session, over the radio channel, in response to successful decoding of the first header; and decoding the second header.

16. A method according to claim 15 wherein the first header and the second header have same coded length, wherein the step of decoding the first header is performed at a first decoding rate and wherein the step of decoding the second header is performed at a second decoding rate that is higher than the first decoding rate.

17. A method according to claim 15 wherein the step of repeatedly transmitting a second header comprises the step of repeatedly transmitting the second header along with at least one stealing bit to indicate transmission of the second header.

18. A method of decoding Radio Link Control/Medium Access Control (RLC/MAC) headers that are repeatedly transmitted and received along with data in a General Packet Radio System (GPRS) on a Global System for Mobile communication (GSM) radio channel during a persistent flow communication session, the decoding method comprising the steps of:

repeatedly transmitting a first RLC/MAC header, including invariant header fields and a Coding and Puncturing Scheme (CPS) header field having changing values, along with data associated with the persistent flow communication session, over the GSM radio channel;

decoding the first header, including the invariant header fields and the CPS header field;

repeatedly transmitting a second RLC/MAC header, including the CPS header field but excluding at least one of the invariant header fields, along with data associated with the persistent flow communication session, over the GSM radio channel, in response to successful decoding of the first header; and decoding the second RLC/MAC header, including the CPS header field but excluding at least one of the invariant header fields.

19. A method according to claim 18 wherein a Power Reduction (PR) field of the RLC/MAC header also has changing values and wherein the step of repeatedly transmitting a second RLC/MAC header comprises the step of:

repeatedly transmitting a second RLC/MAC header, including the CPS and PR header fields but excluding at least one of the invariant header fields, along with data associated with the persistent flow communication session, over the GSM radio channel, in response to the indicating step.

20. A method according to claim 18 wherein the first RLC/MAC header and the second RLC/MAC header have 60 bit coded length, wherein the step of decoding the first RLC/MAC header is performed at a 1/3 decoding rate and wherein the step of decoding the second RLC/MAC header is performed at a 1/12 decoding rate.

21. A method according to claim 18 wherein the step of repeatedly transmitting a second RLC/MAC header comprises the step of repeatedly transmitting the second RLC/MAC header along with at least one stealing bit to indicate transmission of the second RLC/MAC header.

22. A method of transmitting headers along with data on a radio channel during a persistent flow communication session, the method comprising the steps of:
   repeatedly transmitting a first header, including invariant header fields and changing header fields, along with data associated with the persistent flow communication session, over the radio channel;
   receiving an indication that the first header has been decoded successfully; and
   repeatedly transmitting a second header, including the changing header fields but excluding at least one of the invariant header fields, along with data associated with the persistent flow communication session, over the radio channel, in response to the received indication.

23. A method according to claim 22 wherein the first header and the second header have same code length, wherein the step of repeatedly transmitting the first header is performed at a first coding rate and wherein the step of repeatedly transmitting the second header is performed at a second coding rate that is higher than the first coding rate.

24. A method according to claim 22 wherein the step of repeatedly transmitting a second header comprises the step of repeatedly transmitting the second header along with at least one stealing bit to indicate transmission of the second header.

25. A method of transmitting Radio Link Control/Medium Access Control (RLC/MAC) headers along with data in a General Packet Radio System (GPRS) on a Global System for Mobile communication (GSM) radio channel during a persistent flow communication session, the method comprising the steps of:
   repeatedly transmitting a first RLC/MAC header, including invariant header fields and a Coding and Puncturing Scheme (CPS) header field having changing values, along with data associated with the persistent flow communication session, over the GSM radio channel;
   receiving an indication that the first header, including the invariant header fields and the CPS header fields, has been decoded successfully; and
   repeatedly transmitting a second RLC/MAC header, including the CPS header field but excluding at least one of the invariant header fields, along with data associated with the persistent flow communication session, over the GSM radio channel, in response to the received indication.

26. A method according to claim 25 wherein a Power Reduction (PR) field of the RLC/MAC header also has changing values and wherein the step of repeatedly transmitting a second RLC/MAC header comprises the step of:
   repeatedly transmitting a second RLC/MAC header, including the CPS and PR header fields but excluding at least one of the invariant header fields, along with data associated with the persistent flow communication session, over the GSM radio channel, in response to the indicating step.

27. A method according to claim 25 wherein the first RLC/MAC header and the second RLC/MAC header have 60-bit coded length, wherein the step of decoding the first RLC/MAC header is performed at a 1/3 decoding rate and wherein the step of decoding the second RLC/MAC header is performed at a 1/12 decoding rate.

28. A method according to claim 25 wherein the step of repeatedly transmitting a second RLC/MAC header comprises the step of repeatedly transmitting the second RLC/MAC header along with at least one stealing bit to indicate transmission of the second RLC/MAC header.

29. A method of decoding headers that are repeatedly received along with data on a radio channel during a persistent flow communication session, the decoding method comprising the steps of:
   repeatedly receiving a first header, including invariant header fields and changing header fields, along with data associated with the persistent flow communication session, over the radio channel;
   decoding the first header, including the invariant header fields and the changing header fields;
   indicating that the first header, including the invariant header fields and the changing header fields, has been decoded successfully;
   repeatedly receiving a second header, including the changing header fields but excluding at least one of the invariant header fields, along with data associated with the persistent flow communication session, over the radio channel; and
   decoding the second header, including the changing header fields but excluding at least one of the invariant header fields.

30. A method according to claim 29 wherein the first header and the second header have same coded length, wherein the step of decoding the first header is performed at a first decoding rate and wherein the step of decoding the second header is performed at a second decoding rate that is higher than the first decoding rate.

31. A method according to claim 29 wherein the step of repeatedly receiving a second header comprises the step of repeatedly receiving the second header along with at least one stealing bit to indicate the second header.

32. A method of decoding Radio Link control/Medium Access Control (RLC/MAC) headers that are repeatedly received along with data in a General Packet Radio System (GPRS) on a Global System for Mobile communication (GSM) radio channel during a persistent flow communication session, the decoding method comprising the steps of:
   repeatedly receiving a first RLC/MAC header, including invariant header fields and a Coding and Puncturing Scheme (CPS) header field having changing values, along with data associated with the persistent flow communication session, over the GSM radio channel;
   decoding the first header, including the invariant header fields and the CPS header field;
   indicating that the first header, including the invariant header fields and the CPS header fields, has been decoded successfully;
   repeatedly receiving a second RLC/MAC header, including the CPS header field but excluding at least one of the invariant header fields, along with data associated with the persistent flow communication session, over the GSM radio channel; and
   decoding the second RLC/MAC header, including the CPS header field but excluding at least one of the invariant header fields.

33. A method according to claim 32 wherein a Power Reduction (PR) field of the RLC/MAC header also has changing values and wherein the repeatedly receiving step comprises the step of:

repeatedly receiving a second RLC/MAC header, including the CPS and PR header fields but excluding at least one of the invariant header fields, along with data associated with the persistent flow communication session, over the GSM radio channel.

34. A method according to claim 32 wherein the first RLC/MAC header and the second RLC/MAC header have 60-bit coded length, wherein the step of decoding the first RLC/MAC header is performed at a 1/3 decoding rate and wherein the step of decoding the second RLC/MAC header is performed at a 1/12 decoding rate.

35. A method according to claim 32 wherein the step of repeatedly receiving a second RLC/MAC header comprises the step of repeatedly receiving the second RLC/MAC header along with at least one stealing bit to indicate the second RLC/MAC header.

36. A system for decoding a header that includes a plurality of header fields and that is repeatedly transmitted and received along with data on a radio channel, the decoding system comprising:

means for initially decoding at least one initially received header to identify values for the plurality of header fields, the plurality of header fields including invariant header fields having determinate values and changing header fields having changing values; and means for subsequently decoding at least one subsequently received header using the determinate values for at least one of the invariant header fields.

37. A system according to claim 36 further comprising:

means for decoding a second header, including the changing header fields but excluding at least one of the invariant header fields, along with data, in response to the means for subsequently decoding at least one subsequently received header using the determinate values for at least one of the invariant header fields.

38. A system according to claim 36:

wherein the means for initially decoding comprises means for initially predictive decoding at least one initially received header to identify soft values for symbols associated with the plurality of header fields, the plurality of header fields including invariant header fields having determinate values and changing header fields having changing values; and wherein the means for subsequently decoding comprises means for subsequently predictive decoding at least one subsequently received header using a probability value of unity for symbols associated with at least one of the invariant header fields.

39. A system according to claim 36 wherein the means for initially decoding comprises means for initially decoding at least one initially received header to identify values for the plurality of header fields for a predetermined number of times or until the values for the plurality of header fields satisfy a selection criterion.

40. A system according to claim 36 wherein the means for subsequently decoding comprises:

means for subsequently decoding at least one subsequently received header using progressively more reliable estimates of the values for at least one of the invariant header fields; and means for decoding at least one subsequently received header using the determinate values for at least one of the invariant header fields upon successful decoding.

41. A system according to claim 40 further comprising:
means for buffering the headers until successful decoding.

42. A system for decoding a Radio Link Control/Medium Access Control (RLC/MAC) header that includes a plurality of header fields and that is repeatedly transmitted and received along with data in a Generalized Packet Radio Service (GPRS) on a Global System for Mobile communication (GSM) radio channel, the system comprising:

means for initially decoding at least one initially received RLC/MAC header to identify values for the plurality of header fields, the plurality of header fields including invariant header fields having determinate values and a Coding and Puncturing Scheme (CPS) header field having changing value; and means for subsequently decoding at least one subsequently received header using the determinate values for at least one of the invariant header fields.

43. A system according to claim 42 wherein a Power Reduction (PR) field of the RLC/MAC header also has changing values, the means for subsequently decoding comprising:

means for subsequently decoding at least one subsequently received header using the determinate values for at least one of the invariant header fields.

44. A system according to claim 42 further comprising:

means for decoding a second header, including the CPS header field but excluding at least one of the invariant header fields, along with data, in response to the means for subsequently decoding the at least one subsequently received header using the determinate values for at least one of the invariant header fields.

45. A system according to claim 43 further comprising:

means for decoding a second header, including the CPS and the PR header fields but excluding at least one of the invariant header fields, along with data, in response to the means for subsequently decoding the at least one subsequently received header using the determinate values for at least one of the invariant header fields.

46. A system according to claim 42:

wherein the means for initially decoding comprises means for initially predictive decoding at least one initially received header to identify soft values for symbols associated with the plurality of header fields, the plurality of header fields including invariant header fields having determinate values and a CPS header field having changing values; and wherein the means for subsequently decoding comprises means for subsequently predictive decoding at least one subsequently received header using a probability value of unity for symbols associated with at least one of the invariant header fields.

47. A system according to claim 42 wherein the means for initially decoding comprises means for initially decoding at least one initially received header to identify values for the plurality of header fields for a predetermined number of times or until the values for the plurality of header fields are successfully identified.

48. A system according to claim 42 wherein the means for subsequently decoding comprises:

means for subsequently decoding at least one subsequently received header using progressively more reliable estimates of the values for at least one of the invariant header fields; and means for decoding at least one subsequently received header using the determinate values for at least one of the invariant header fields, upon successful decoding.

49. A system according to claim 48 further comprising:
means for buffering the headers until successful decoding.

50. A system for decoding headers that are repeatedly transmitted and received along with data on a radio channel during a persistent flow communication session, the decoding system comprising:
- means for repeatedly transmitting a first header, including invariant header fields and changing header fields, along with data associated with the persistent flow communication session, over the radio channel;
- means for decoding the first header;
- means for repeatedly transmitting a second header, including the changing header fields but excluding at least one of the invariant header fields, along with data associated with the persistent flow communication session, over the radio channel, in response to successful decoding of the first header; and
- means for decoding the second header.

51. A system according to claim 50 wherein the first header and the second header have same coded length, wherein the means for decoding the first header operates at a first decoding rate and wherein the means for decoding the second header operates at a second decoding rate that is higher than the first decoding rate.

52. A system according to claim 50 wherein the means for repeatedly transmitting a second header comprises means for repeatedly transmitting the second header along with at least one stealing bit to indicate transmission of the second header.

53. A system for decoding Radio Link Control/Medium Access Control (RLC/MAC) headers that are repeatedly transmitted and received along with data in a General Packet Radio System (GPRS) on a Global System for Mobile communication (GSM) radio channel during a persistent flow communication session, the decoding system comprising:
- means for repeatedly transmitting a first RLC/MAC header, including invariant header fields and a Coding and Puncturing Scheme (CPS) header field having changing values, along with data associated with the persistent flow communication session, over the GSM radio channel;
- means for decoding the first header, including the invariant header fields and the CPS header field;
- means for repeatedly transmitting a second RLC/MAC header, including the CPS header field but excluding at least one of the invariant header fields, along with data associated with the persistent flow communication session, over the GSM radio channel, in response to successful decoding of the first header; and
- means for decoding the second RLC/MAC header, including the CPS header field but excluding at least one of the invariant header fields.

54. A system according to claim 53 wherein a Power Reduction (PR) field of the RLC/MAC header also has changing values and wherein the means for repeatedly transmitting a second RLC/MAC header comprises:
- means for repeatedly transmitting a second RLC/MAC header, including the CPS and PR header fields but excluding at least one of the invariant header fields, along with data associated with the persistent flow communication session, over the GSM radio channel, in response to the indicating means.

55. A system according to claim 53 wherein the first RLC/MAC header and the second RLC/MAC header have 60 bit coded length, wherein the means for decoding the first RLC/MAC header operates at a 1/3 decoding rate and wherein means for decoding the second RLC/MAC header operates at a 1/12 decoding rate.

56. A system according to claim 53 wherein the means for repeatedly transmitting a second RLC/MAC header comprises means for repeatedly transmitting the second RLC/MAC header along with at least one stealing bit to indicate transmission of the second RLC/MAC header.

57. A base station that transmits headers along with data on a radio channel during a persistent flow communication session, comprising:
- a transmitter that repeatedly transmits a first header, including invariant header fields and changing header fields, along with data associated with the persistent flow communication session, over the radio channel; and
- a receiver that receives an indication that the first header, including the invariant header fields and the changing header fields, has been decoded successfully;
- the transmitter repeatedly transmitting a second header, including the changing header fields but excluding at least one of the invariant header fields, along with data associated with the persistent flow communication session, over the radio channel, in response to the received indication from the receiver.

58. A base station according to claim 57 wherein the first header and the second header have same code length, wherein the transmitter codes the first header at a first coding rate and codes the second header at a second coding rate that is higher than the first coding rate.

59. A base station according to claim 57 wherein the transmitter repeatedly transmits the second header along with at least one stealing bit to indicate transmission of the second header.

60. A Base Station System (BSS) that transmits Radio Link Control/Medium Access Control (RLC/MAC) headers along with data in a General Packet Radio System (GPRS) on a Global System for Mobile communication (GSM) radio channel during a persistent flow communication session, the BSS comprising:
- a transmitter that repeatedly transmits a first RLC/MAC header, including invariant header fields and a Coding and Puncturing Scheme (CPS) header field having changing values, along with data associated with the persistent flow communication session over the GSM radio channel; and
- a receiver that receives an indication that the first header, including the invariant header fields and the CPS header field, has been decoded successfully;
- the transmitter repeatedly transmitting a second RLC/MAC header, including the CPS header field but excluding at least one of the invariant header fields, along with data associated with the persistent flow communication session, over the GSM radio channel, in response to the received indication.

61. A BSS according to claim 60 wherein a Power Reduction (PR) field of the RLC/MAC header also has changing values and wherein the transmitter repeatedly transmits the second RLC/MAC header, including the CPS and PR header fields but excluding at least one of the invariant header fields, along with data associated with the persistent flow communication session, over the GSM radio channel, in response to the received indication.

62. A BSS according to claim 60 wherein the first RLC/MAC header and the second RLC/MAC header have 60-bit coded length, wherein transmitter codes the first RLC/MAC header at a 1/3 decoding rate and wherein the transmitter codes the second RLC/MAC header at a 1/12 decoding rate.

63. A BSS according to claim 60 wherein the transmitter repeatedly transmits the second RLC/MAC header along with at least one stealing bit to indicate transmission of the second RLC/MAC header.

64. A mobile terminal that decodes headers that are repeatedly received along with data on a radio channel during a persistent flow communication session, the mobile terminal comprising:

a receiver that repeatedly receives a first header, including invariant header fields and changing header fields, along with data associated with the persistent flow communication session, over the radio channel;

a decoder that decodes the first header; and a transmitter that indicates that the first header has been decoded successfully;

the receiver repeatedly receiving a second header, including the changing header fields but excluding at least one of the invariant header fields, along with data associated with the persistent flow communication session, over the radio channel; and the decoder decoding the second header.

65. A mobile terminal according to claim 64 wherein the first header and the second header have same coded length, wherein the decoder decodes the first header at a first decoding rate and wherein the decoder decodes the second header at a second decoding rate that is higher than the first decoding rate.

66. A mobile terminal according to claim 64 wherein the receiver repeatedly receives the second header along with at least one stealing bit to indicate the second header.

67. A Mobile Terminal (MT) that decodes Radio Link Control/Medium Access Control (RLC/MAC) headers that are repeatedly received along with data in a General Packet Radio System (GPRS) on a Global System for Mobile communication (GSM) radio channel during a persistent flow communication session, the MT comprising:

a receiver that repeatedly receives a first RLC/MAC header, including invariant header fields and a Coding and Puncturing Scheme (CPS) header field having changing values, along with data associated with the persistent flow communication session, over the GSM radio channel;

a decoder that decodes the first header, including the invariant header fields and the CPS header field; and a transmitter that indicates that the first header, including the invariant header fields and the CPS header fields, have been decoded successfully;

the receiver repeatedly receiving a second RLC/MAC header, including the CPS header field but excluding at least one of the invariant header fields, along with data associated in the persistent flow communication session, over the GSM radio channel; and the decoder decoding the second RLC/MAC header, including the CPS header field but excluding at least one of the invariant header fields.

68. An MT according to claim 67 wherein a Power Reduction (PR) field of the RLC/MAC header also has changing values and wherein the receiver repeatedly receives the second RLC/MAC header, including the CPS and PR header fields but excluding at least one of the invariant header fields, along with data associated with the persistent flow communication session, over the GSM radio channel.

69. An MT according to claim 67 wherein the first RLC/MAC header and the second RLC/MAC header have 60-bit coded length, wherein the decoder decodes the first RLC/MAC header at a 1/3 decoding rate and wherein decoder decodes the second RLC/MAC header at a 1/12 decoding rate.

70. An MT according to claim 67 wherein the receiver repeatedly receives the second RLC/MAC header along with at least one stealing bit to indicate the second RLC/MAC header.

* * * * *